(12) United States Patent
Ju et al.

(10) Patent No.: US 7,616,052 B1
(45) Date of Patent: Nov. 10, 2009

(54) FAST ADAPTING FILTER

(75) Inventors: Shu-Ing Ju, Palo Alto, CA (US); Hee Wong, San Jose, CA (US)

(73) Assignee: National Semicondcutor Corporation, Santa Clara, CA (US)

( * ) Notice: Subject to any disclaimer, the term of this patent is extended or adjusted under 35 U.S.C. 154(b) by 46 days.

(21) Appl. No.: 10/379,368

(22) Filed: Mar. 4, 2003

(51) Int. Cl.
*H03K 5/00* (2006.01)

(52) U.S. Cl. ..................... 327/552; 708/819

(58) Field of Classification Search ......... 327/551–559; 234/462.26; 375/345; 455/324; 708/819
See application file for complete search history.

(56) References Cited

U.S. PATENT DOCUMENTS

| | | | | |
|---|---|---|---|---|
| 4,441,082 A * | 4/1984 | Haque | ..................... | 330/129 |
| 4,768,205 A * | 8/1988 | Nakayama | ................. | 375/232 |
| 5,293,139 A * | 3/1994 | Polonen et al. | ............... | 333/14 |
| 6,073,848 A * | 6/2000 | Giebel | .................. | 235/462.26 |
| 6,373,907 B1 * | 4/2002 | Katsura et al. | .............. | 375/345 |
| 6,498,927 B2 * | 12/2002 | Kang et al. | .............. | 455/245.2 |
| 6,791,401 B2 * | 9/2004 | Miwa | ........................ | 327/556 |
| 7,212,798 B1 * | 5/2007 | Adams et al. | ............ | 455/251.1 |

\* cited by examiner

*Primary Examiner*—Dinh T. Le

(57) ABSTRACT

Adjustable gain circuits (AGCs) within serial filter stages are initialized to maximum gain. The output of each AGC is then sampled and converted to digital representation for use by control logic in setting the gain for the respective AGC. The gain adjustment decision for each AGC is performed in one shot, sequentially backwards from the last AGC, such that gain may be adapted simply and quickly within a number of cycles equal to the number of AGCs. Performance is enhanced by a fast-adapting cell in which capacitances are switched into the input path and feedback loop of an amplifier to reduce direct current gain within the transfer function through charge sharing dividing down the output voltage.

20 Claims, 4 Drawing Sheets

FAST ADAPTING FILTER

TECHNICAL FIELD OF THE INVENTION

The present invention is directed, in general, to wireless receivers and, more specifically, to gain control for signal filtering within wireless receivers.

BACKGROUND OF THE INVENTION

In wireless communication systems, the desired or wanted signals coexist with a wide band of unwanted signals, where the power of the unwanted signals can often be much higher than the power of the wanted signals.

A filter is typically employed within wireless receivers to reject the unwanted signals. In addition, to optimize the system, an adjustable or adaptable gain circuit (AGC) associated with the filter is necessary to raise the power level of the wanted signal as early as possible within the receiver stages. However, a gain circuit integrated with the filter may have a slow response time when the gain is changed. The filter's bandwidth and the AGC settling time are typically the primary response time limitations for such circuits.

There is, therefore, a need in the art for an adjustable gain filter mechanism with fast gain response.

SUMMARY OF THE INVENTION

To address the above-discussed deficiencies of the prior art, it is a primary object of the present invention to provide, for use in a wireless receiver, adjustable gain circuits (AGCs) within serial filter stages that are initialized to maximum gain. The output of each AGC is then sampled and converted to digital representation for use by control logic in setting the gain for the respective AGC. The gain adjustment decision for each AGC is performed in one shot, sequentially backwards from the last AGC, such that gain may be adapted simply and quickly within a number of cycles equal to the number of AGCs. Performance is enhanced by a fast-adapting cell in which capacitances are switched into the input path and feedback loop of an amplifier to reduce direct current gain within the transfer function through charge sharing dividing down the output voltage.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
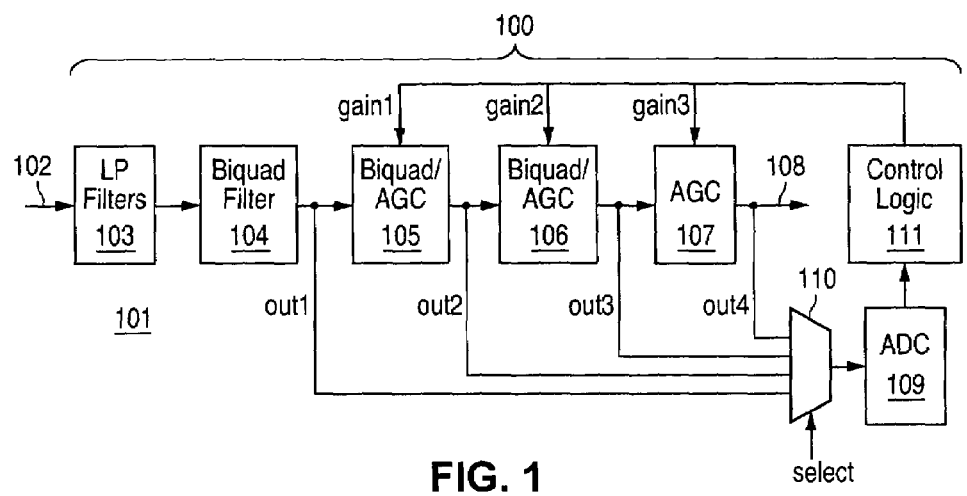
FIG. 1 depicts a fast adapting filter within a wireless device according to one embodiment of the present invention.

FIG. 1 depicts a fast adapting filter within a wireless device according to one embodiment of the present invention. The fast adapting filter system 100 of the present invention may be implemented within a wireless device 101 such as a mobile or cordless telephone, a personal digital assistant (PDA) with wireless communications capability, or a wireless connectivity device such as a wireless network interface for a laptop or other personal computer. The filter system 100 is implemented within the wireless receiver portion of a wireless device, and operates on a signal received by an antenna and passed through, for example, a low noise amplifier (LNA) and mixer, which are not depicted in FIG. 1, to produce an input signal 102 for the filter system 100.

Those skilled in the art will recognize that the full structure and operation of a wireless device or wireless receiver are not depicted in FIG. 1 or described herein. Instead, for simplicity and clarity, only so much of a wireless device or receiver as is unique to the present invention or necessary for an understanding of the invention is depicted and described.

In the present invention, in order to quickly adapt the gain of an AGC/filter, a particular arrangement of the AGC/filter(s) and the associated outputs is employed to enable implementation of a one-shot adaptation scheme capable of achieving fast speed. In addition, a filter with a fast gain response time is employed at each of the monitored outputs.

The fast adapting filter system 100 of the present invention includes, in an exemplary embodiment, two low pass (LP) filters 103 receiving the input signal 102. Alternatively, an anti-alias filter (AAF) may be employed in place of LP filters 103. A biquad (two-pole, two-zero) or notch filter 104 receives the output of LP filters 103. The output of filter 104 is, in turn, received by a series of biquad or notch filters with integral AGC 105 and 106. A separate AGC 107 receives the output of the last filter/AGC 106 within that series. The output 108 of AGC 107 is employed by further signal processing (e.g., demodulation and/or decoding) circuitry within the wireless receiver (not shown).

An analog-to-digital converter (ADC) 109 selectively receives, through multiplexer 110, the outputs of each of filter 104, AGC/filters 105 and 106, and AGC 107. Based on the output of ADC 109, control logic 111 sets the gain for each AGC/filter or AGC component 105-107 within filter system 100. The four outputs selectively passed by multiplexer 110, together with ADC 109 and control logic 111, form the AGC control loop. Each biquad/AGC 105 and 106 is capable of adjusting the respective output signal level according to the gain setting specified by control logic 111 within one clock period, as described in further detail below. The AGC components 105-107 collectively provide an adjustable gain of output signal 108 over input signal 102 within a range preferably from 0 decibels (dB) to 54 dB.

In operation, the AGC components of filter system 100 are reset to full gain (54 dB) during initialization. ADC 109 samples the four outputs out1, out2, out3 and out4 routed by multiplexer 110 one at a time. First, ADC 109 samples output out3. Then the AGC control gain3 is set by control logic 111, and the gain of the third gain stage (AGC 107) is set according to the out3 signal level using gain3. Next, ADC 109 samples output out2, then the AGC control gain2 is set by control logic 111 and the gain of the second gain stage (AGC/filter 106) is set according to the out2 signal level using gain2. ADC 109 next samples output out1, then the AGC control gain1 is set by control logic 111 and the gain of the first gain stage (AGC/filter 105) is set according to the out1 signal level using gain1. ADC 109 may optionally sample output out4 to allow control logic 111 to verify the correct signal level of output signal 108.

The above-described backward gain adaptation process is simple, with the decision regarding each gain stage performed in one shot. Thus, in three sampling cycles, the filter system 100 may be initialized in a workable condition. The arrangement of AGC/filter and AGC components allows this simple and fast adapting scheme to be achieved. A forward gain adaptation process may also be performed for the same configuration. In addition, if the wireless device 101 employs more than one filter channel, the ADC 109 may be used to monitor all of the AGC component outputs for each channel, reducing die size and power consumption.

As illustrated in the exemplary embodiment, the AGC components within filter system 100 may be stand alone (e.g., AGC 107) or integrated with filters (e.g., AGC/filters 105 and 106). For a filter with integral AGC, the AGC portion may be placed before or after the filter. The order is flexible and may be varied according to system requirements.

Figure 2:
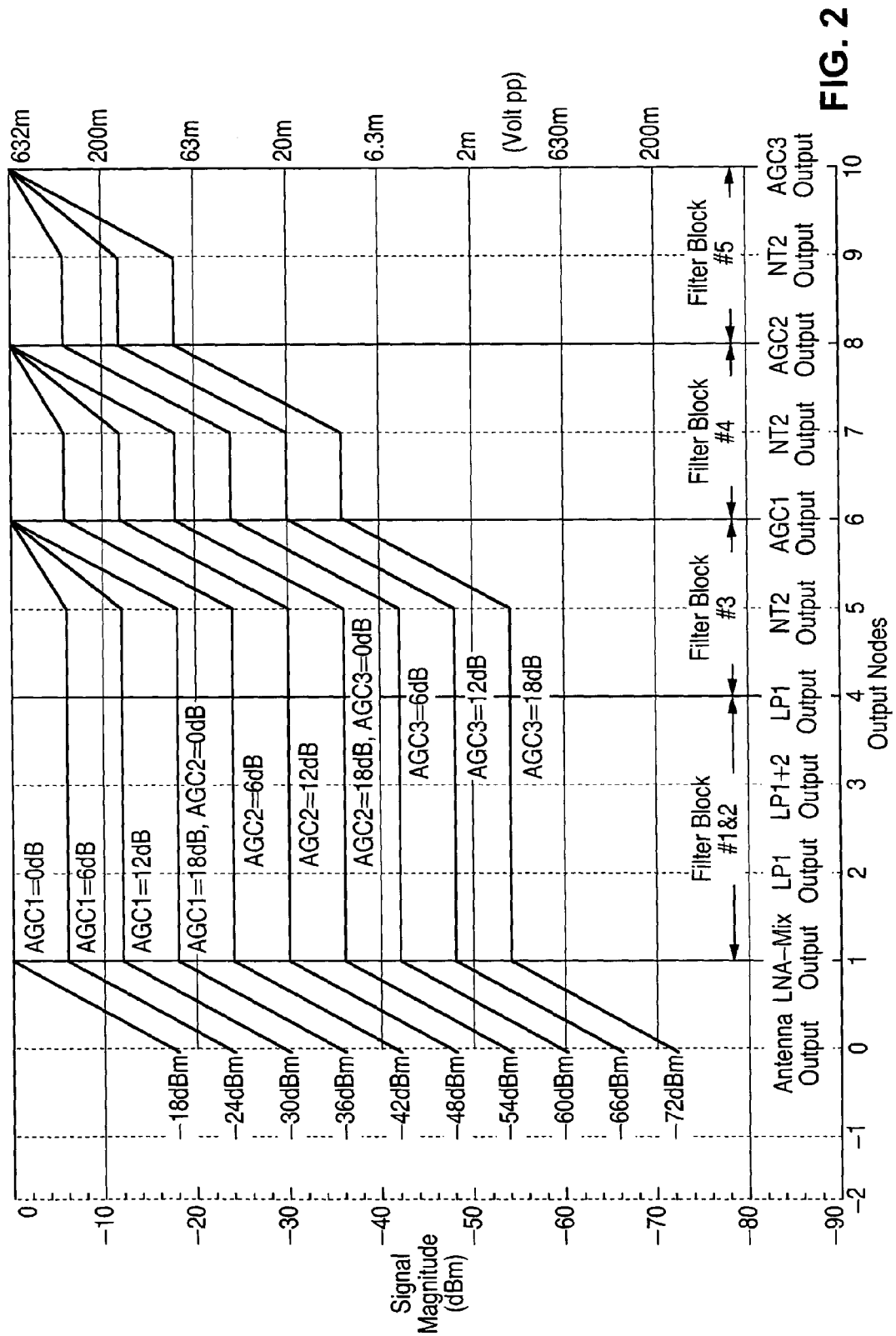
FIG. 2 is a plot of the magnitude response for AGC settings as a function of the various sampled outputs within a fast adapting filter for a wireless device according to one embodiment of the present invention.

FIG. 2 is a plot of the magnitude response for AGC settings as a function of the various sampled outputs within a fast adapting filter for a wireless device according to one embodiment of the present invention. As illustrated, the gain settings depend on the signals level's at the respective nodes.

Figure 3:
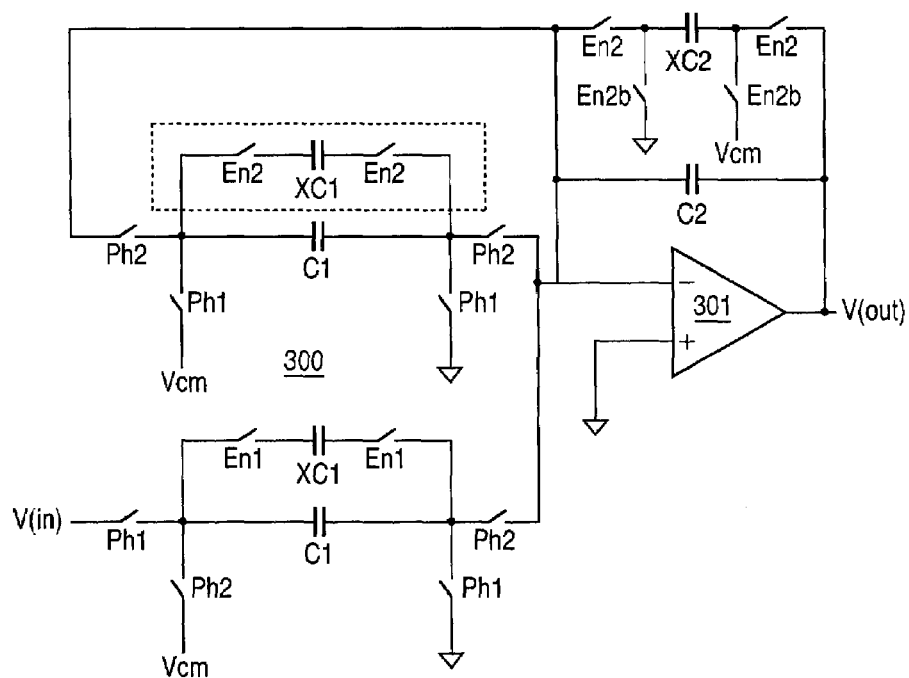
FIG. 3 depicts a fast gain-switching cell for a fast adapting filter according to one embodiment of the present invention.

FIG. 3 depicts a fast gain-switching cell for a fast adapting filter according to one embodiment of the present invention. The fast gain-switching cell 300 may be employed for AGC/filters 105-106 depicted in FIG. 1. In the exemplary embodiment, the fast response time is obtained only when the gain is changed from high to low (e.g., from 18 dB to 0 dB).

For a regular filter/gain stage, the amount of time required to reach the correct signal level when the gain is changed generally depends at least in part on the bandwidth of the filter/gain stage. This period may be a long time if the bandwidth is low, which is normally the case for a wireless baseband filter. The fast gain-switching filter of the present invention can settle the output level in one clock cycle, with a settling time independent of the filter bandwidth.

For simplicity, a first order low pass filter/gain stage is employed to describe the fast gain-switching scheme of the present invention. However, those skilled in the art will recognize that the fast gain-switching mechanism of the present invention is not limited to a first order filter, but may be utilized in high order filters as well.

Fast gain-switching cell 300 in the exemplary embodiment is a first order switched capacitor low pass filter with fast gain response time. The filter and gain mechanisms are represented as an operational amplifier (op-amp) 301 with both fixed and switched capacitances coupled to the input and within a negative feedback loop. Two non-overlapping clock signals Ph1 and Ph2 determine the filter's sampling frequency.

Six capacitors with capacitance C1, C2, XC1 and XC2 are coupled within fast gain-switching cell 300. The capacitance XC1 is equal to a multiple X of capacitance C1 (i.e., XC1=X*C1), and the capacitance XC2 is equal to a multiple X of capacitance C2 (i.e., XC2=X*C2), with the ratio X determining the maximum gain of the low pass filter. Control signal En1, which controls the gain setting for fast gain-switching cell 300 by controlling the various switches labeled En1, and control signal En2, which enables capacitance XC2 to absorb the charge from capacitance C2 by controlling the various switches labeled En1, are synchronized with clock signal Ph1.

The capacitance C1 connected between the filter input V(in) and the negative op-amp input is alternately switched between connection between the input voltage V(in) and ground by clock signal Ph1 and connection between a charging voltage Vcm and the negative op-amp input by clock signal Ph2. The capacitance C1 coupled within the feedback loop is alternately within the feedback loop by clock signal Ph2 and between the charging voltage Vcm and ground by clock signal Ph1.

The capacitance XC1 connected between the filter input V(in) and the negative op-amp input is connected or disconnected in parallel with the corresponding capacitance C1 connected between the filter input V(in) and the negative op-amp input by control signal En1. The capacitance XC1 within the feedback loop and the capacitance XC2 are connected or disconnected in parallel with the capacitance C1 within the feedback loop or the capacitance C2, respectively, by the control signal En2. Additionally, capacitance XC2 may be selectively connected between the charging voltage Vcm and ground by control signal En2b (produced by inversion of signal En2) for precharging capacitance XC2 to a DC equilibrium state. The charging voltage Vcm determines the amplifier's direct current output voltage. In addition, capacitors XC1 and XC2 are switched into and out of the feedback path to keep the bandwidth constant, as well as adjust the gain. In some embodiments, the gain or bandwidth for each of the two or more adjustable gain circuits is adjusted by switching capacitances into or out of one or more of an input path and a feedback loop for amplifier 301.

Figure 4:
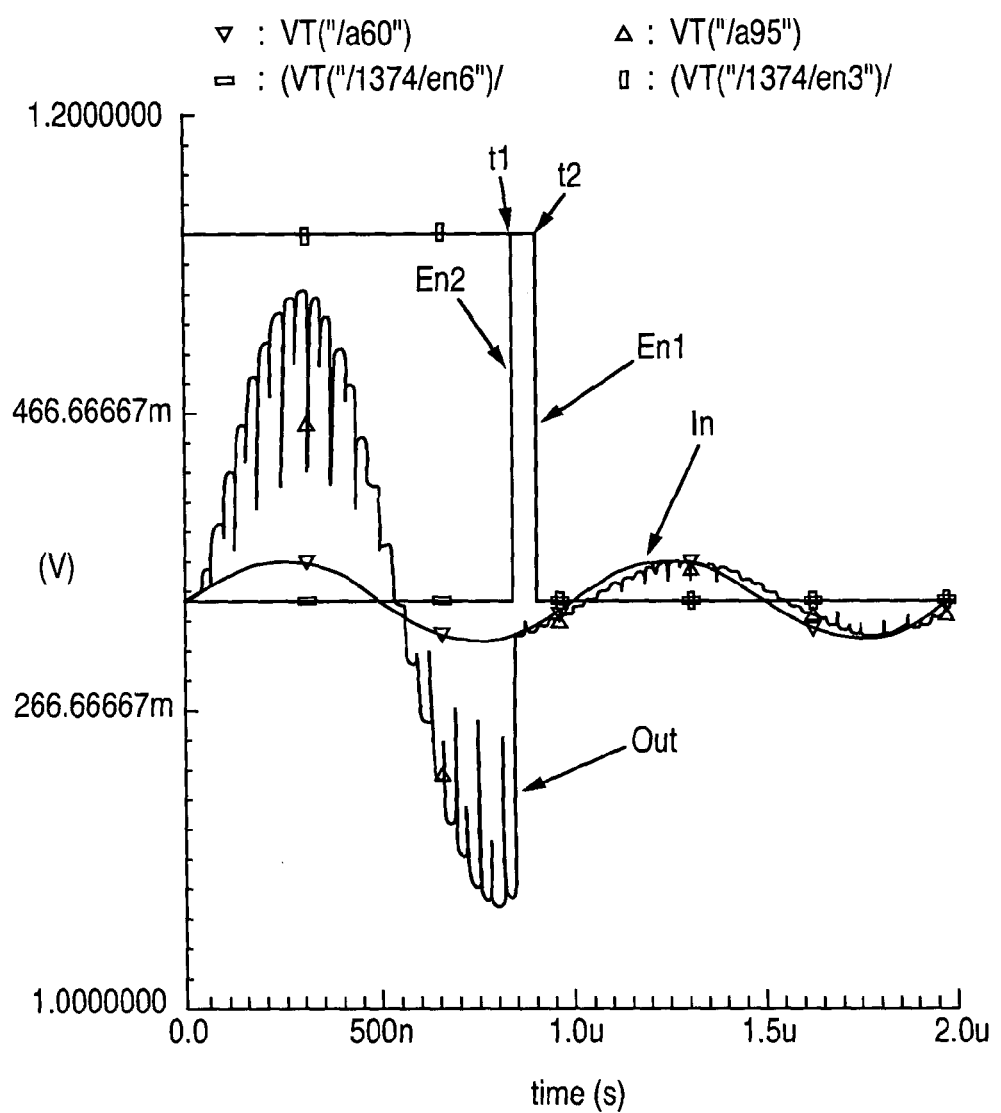
FIG. 4 is a signal response plot of a fast gain-switching cell for a fast adapting filter according to one embodiment of the present invention.

FIG. 4 is a signal response plot of a fast gain-switching cell for a fast adapting filter according to one embodiment of the present invention, and is intended to be taken in conjunction with the fast gain-switching cell 300 depicted in FIG. 3. The output and control signals are plotted for a gain change at time t1. Before time t1, control signal En1 is high and control signal En2 is low. The transfer function H for the filter prior to time t1 is:

$$H = \frac{V(out)}{V(in)} = \frac{(X+1) \cdot (C1 \times Z^{-1/2})}{(C1 + C2 - C2 \times Z^{-1})}. \quad (1)$$

The direct current (DC) gain of the fast gain-switching cell 300 under such circumstances is equal to (X+1).

During the period between times t1 and t2, control signal En1 is still high and control signal En2 is set to active high, but remains active high for only one clock cycle. Before time t1, there is no signal charge stored in capacitance XC2. Once capacitance XC2 is attached to capacitance C2 by closing the switches labeled En2, charge sharing occurs between capacitances C2 and XC2, such that the filter output voltage is divided down and becomes V(out)/(X+1). The transfer function for the filter at this point is:

$$H = \frac{(C1 \times Z^{-1/2})}{(C1 + C2 - C2 \times Z^{-1})}. \quad (2)$$

The DC gain is then equal to 1 rather than (X+1).

After time t2, capacitances XC1 and XC2 are disabled and detached from the filter. The filter transfer function remains unchanged from the previous state. The output response during gain transition, shown in FIG. 4, has a clean response with almost no error.

Figure 5:
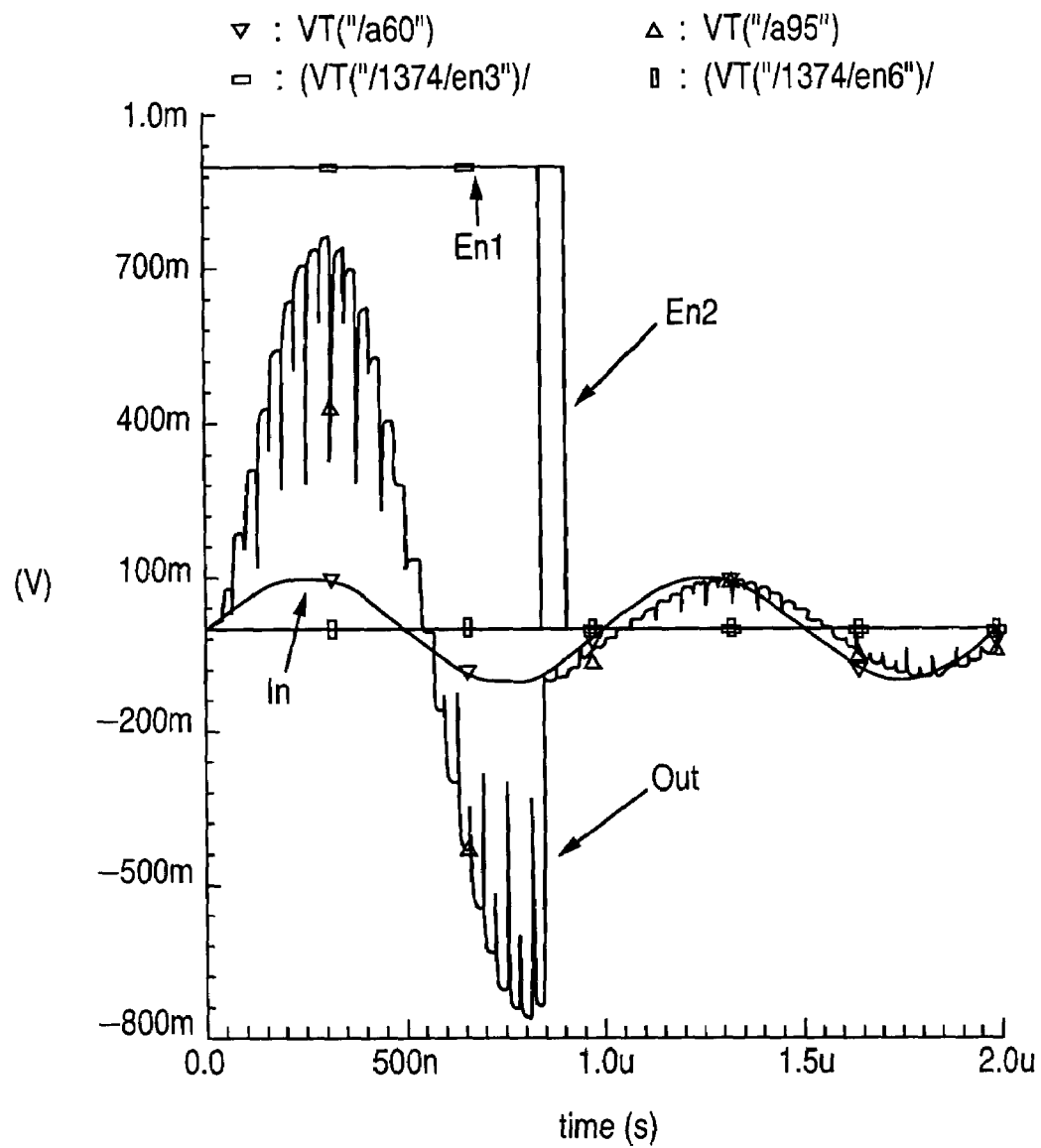
FIG. 5 is a signal response plot of a special case fast gain-switching cell for a fast adapting filter according to one embodiment of the present invention.

FIG. 5 is a signal response plot of a special case fast gain-switching cell for a fast adapting filter according to one embodiment of the present invention, and is also intended to be taken in conjunction with the fast gain-switching cell 300 depicted in FIG. 3. FIG. 5 illustrates the output response when the capacitance C1 equals the capacitance C2. In this case, the devices within the dashed-line box in FIG. 3 (two switches and one capacitance XC1) may be eliminated to reduce the size of the filter circuitry. Control signal En1 is set low at time t1 instead of time t2, with the transfer function for the filter during the period between time t1 and time t2 being:

$$H = \frac{(1 \times Z^{-1/2})}{((X+2) - (X+1)Z^{-1})}. \quad (3)$$

The DC gain is still 1 during the period between times t1 and t2, but the filter bandwidth differs and a small amount of error due to the bandwidth variation is created in one clock period, before control signal En2 returns low.

For wireless systems, a filter integrated with AGC can optimize system performance. The fast adapting filter of the present invention offers a solution for bringing up or changing the system in a quick and simple manner. The fast gain-switching cell enhances the fast adaptation scheme, and also allows fast optimization of the gain setting. The technique of the present invention may be implemented not only in a first order switched capacitor filter cell, but also in high order filters. While the exemplary embodiment relates to a Bluetooth application, the invention is not limited to a specific system and may be applied to other wireless systems to achieve similar performance improvements.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A fast adapting filter structure comprising:
   two or more adjustable gain circuits within or between serially connected filters;
   a multiplexer configured to receive and selectively provide outputs of the adjustable gain circuits; and
   a controller configured to sample the outputs of the adjustable gain circuits provided by the multiplexer and to generate gain control signals sequentially setting a gain for each of the adjustable gain circuits backward from a last adjustable gain circuit.

2. The structure according to claim 1, wherein each of the two or more adjustable gain circuits is initialized to maximum gain.

3. The structure according to claim 1, wherein each of the two or more adjustable gain circuits comprises a fast gain-switching cell including an amplifier, and
   wherein gain or bandwidth for each of the two or more adjustable gain circuits is adjusted by switching capacitances into or out of one or more of an input path and a feedback loop for the amplifier.

4. The structure according to claim 3, wherein the switched capacitances have capacitance values that are multiples of fixed capacitances within the input path and the feedback loop with which the switched capacitances are connected in parallel when switched into the input path and feedback loop.

5. The structure according to claim 3, wherein the gain is adjusted by switching one capacitance out of the input path and switching one or more capacitances into the feedback loop.

6. The structure according to claim 1, wherein the two or more adjustable gain circuits comprise at least one of:
   an adjustable gain circuit integral with one of the filters; and
   an adjustable gain circuit discrete from but connected to at least one of the filters.

7. The structure according to claim 1, wherein an overall gain of the structure is adjusted within a number of clock cycles not greater than a number of adjustable gain circuits within the structure.

8. A method of adapting a filter structure comprising:
   operating two or more adjustable gain circuits within or between serially connected filters;
   receiving and selectively providing outputs of the adjustable gain circuits using a multiplexer;
   sampling the outputs of the adjustable gain circuits provided by the multiplexer; and
   generating gain control signals sequentially setting a gain for each of the adjustable gain circuits backward from a last adjustable gain circuit based on the sampling of the outputs of the adjustable gain circuits.

9. The method according to claim 8, further comprising:
   initializing each of the two or more adjustable gain circuits to maximum gain.

10. The method according to claim 8, further comprising:
adjusting gain or bandwidth for each of the two or more adjustable gain circuits by switching capacitances into or out of one or more of an input path and a feedback loop for an amplifier.

11. The method according to claim 10, wherein the switched capacitances have capacitance values that are multiples of fixed capacitances within the input path and the feedback loop with which the switched capacitances are connected in parallel when switched into the input path and feedback loop.

12. The method according to claim 10, further comprising:
adjusting the gain by switching one capacitance out of the input path and switching one or more capacitances into the feedback loop.

13. The method according to claim 8, wherein operating the two or more adjustable gain circuit comprises at least one of:
operating one of the adjustable gain circuits integral with one of the filters; and
operating one of the adjustable gain circuits discrete from but connected to at least one of the filters.

14. The method according to claim 8, further comprising:
adjusting an overall gain of the structure within a number of clock cycles not greater than a number of adjustable gain circuits within the structure.

15. A fast adapting filter structure comprising:
two or more serially connected filters with integral adjustable gain circuits;
a discrete adjustable gain circuit connected to or between the serially connected filters;
a multiplexer configured to receive and selectively provide outputs of the integral and discrete adjustable gain circuits;
an analog-to-digital converter configured to sequentially sample the outputs of the integral and discrete adjustable gain circuits provided by the multiplexer and to generate digital signals representing signal levels of the outputs; and
control logic configured to receive the digital signals and to generate a gain control signal for each of the integral and discrete adjustable gain circuits.

16. The structure of claim 15 wherein the control logic is configured to initialize the integral and discrete adjustable gain circuits with maximum gain and to sequentially adjust gain for the integral and discrete adjustable gain circuits backwards from a last adjustable gain circuit.

17. The structure of claim 15 wherein each of the adjustable gain circuits can be set to at least three gain levels.

18. The structure of claim 15 wherein each of the filters with integral adjustable gain circuits further comprises:
an amplifier;
a first fixed capacitance within an input path for the amplifier;
a second fixed capacitance within a feedback loop for the amplifier;
a first switched capacitance connected to be selectively switched out of the input path to adjust a gain of the amplifier; and
a second switched capacitance connected to be selectively switched into the feedback loop to adjust the gain or bandwidth of the amplifier,
wherein a ratio of a capacitive value for the first switched capacitance to a capacitive value for the first fixed capacitance equals a ratio of a capacitive value for the second switched capacitance to a capacitive value for the second fixed capacitance.

19. A fast adapting filter structure comprising:
two or more serially connected filters with integral adjustable gain circuits;
a discrete adjustable gain circuit connected to or between the serially connected filters;
an analog-to-digital converter configured to sequentially sample outputs of the integral and discrete adjustable gain circuits and to generate digital signals representing signal levels of the outputs; and
control logic configured to receive the digital signals and to generate a gain control signal for each of the integral and discrete adjustable gain circuits;
wherein each of the filters with integral adjustable gain circuits comprises:
an amplifier;
a first fixed capacitance within an input path for the amplifier;
a second fixed capacitance within a feedback loop for the amplifier;
a third fixed capacitance within the feedback loop;
a first switched capacitance connected to be selectively switched out of the input path to adjust a rain of the amplifier;
a second switched capacitance connected to be selectively switched into the feedback loop to adjust the gain or bandwidth of the amplifier; and
a third switched capacitance connected to be selectively switched into the feedback loop to adjust the gain of the amplifier;
wherein a ratio of a capacitive value for the first switched capacitance to a capacitive value for the first fixed capacitance equals a ratio of a capacitive value for the second switched capacitance to a capacitive value for the second fixed capacitance; and
wherein a ratio of a capacitive value for the third switched capacitance to a capacitive value for the third fixed capacitance equals the ratio of the capacitive value for the second switched capacitance to the capacitive value for the second fixed capacitance, and a capacitive value for the third fixed capacitance equals the capacitive value for the first fixed capacitance.

20. The structure of claim 19 wherein the first switched capacitance is switched out of the input path after the second and third switched capacitances are switched into the feedback loop during gain adjustment.

* * * * *

UNITED STATES PATENT AND TRADEMARK OFFICE
CERTIFICATE OF CORRECTION

PATENT NO. : 7,616,052 B1  Page 1 of 1
APPLICATION NO. : 10/379368
DATED : November 10, 2009
INVENTOR(S) : Shu-Ing Ju and Hee Wong It is certified that error appears in the above-identified patent and that said Letters Patent is hereby corrected as shown below:

Column 7, claim 13, line 17, delete "circuit" and replace with --circuits--; and Column 8, claim 19, line 33, delete "rain" and replace with --gain--.

Signed and Sealed this

Eighth Day of June, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,616,052 B1 |
| APPLICATION NO. | : 10/379368 |
| DATED | : November 10, 2009 |
| INVENTOR(S) | : Ju et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1225 days.

Signed and Sealed this

Nineteenth Day of October, 2010

David J. Kappos
*Director of the United States Patent and Trademark Office*